(12) United States Patent
Maeno

(10) Patent No.: US 7,161,235 B2
(45) Date of Patent: Jan. 9, 2007

(54) SEMICONDUCTOR APPARATUS OF A PLURALITY OF SEMICONDUCTOR DEVICES ENCLOSED IN CASE AND WIRING METHOD THEREFORE

(75) Inventor: Kazuhiro Maeno, Aichi-ken (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/301,252

(22) Filed: Nov. 21, 2002

(65) Prior Publication Data
US 2003/0100148 A1 May 29, 2003

(30) Foreign Application Priority Data
Nov. 26, 2001 (JP) .............................. 2001-359156

(51) Int. Cl.
*H01L 23/52* (2006.01)

(52) U.S. Cl. ...................... 257/691; 257/693; 257/698; 257/E23.79

(58) Field of Classification Search ......... 257/678–700
See application file for complete search history.

(56) References Cited

U.S. PATENT DOCUMENTS

| | | | |
|---|---|---|---|
| 5,523,620 A * | 6/1996 | Eytcheson et al. .......... 257/690 |
| 5,646,445 A * | 7/1997 | Masumoto et al. ......... 257/723 |
| 5,761,040 A * | 6/1998 | Iwasa et al. ................. 361/704 |
| 5,967,858 A | 10/1999 | Yamada ...................... 439/736 |
| 6,160,307 A * | 12/2000 | Kweon ........................ 257/676 |
| 6,242,707 B1 * | 6/2001 | Mody et al. ................... 218/1 |
| 6,353,258 B1 | 3/2002 | Inoue et al. ................. 257/723 |
| 6,501,167 B1 * | 12/2002 | Hanamura ................... 257/691 |
| 6,940,022 B1 * | 9/2005 | Vinciarelli et al. ......... 174/256 |
| 2002/0015291 A1 * | 2/2002 | Kohjiro et al. ............. 361/760 |

FOREIGN PATENT DOCUMENTS

| | | |
|---|---|---|
| DE | 8700978 U1 | 4/1987 |
| EP | 0 588 094 A1 | 3/1994 |
| EP | 0 780 898 A1 | 6/1997 |
| EP | 0 987 762 | 3/2000 |
| EP | 1 098 369 | 5/2001 |
| JP | 2001-102519 | 4/2001 |

* cited by examiner

*Primary Examiner*—H. Jey Tsai
(74) *Attorney, Agent, or Firm*—Morgan & Finnegan, LLP (57) ABSTRACT

A drain electrode wiring conductor through which a main current of a MOS transistor takes the form of a flat board, being inserted into a first side of the frame of a case, and extends along the first side. The source electrode wiring conductor also takes the form of a flat board, being inserted into the first side and a second side, and extends parallel to a drain electrode wiring conductor along the first side. The flow of the current in the drain electrode wiring conductor is opposite in direction to the flow of the current in the source electrode wiring conductor. With the configuration, the parasitic inductance of a semiconductor module including a plurality of MOS transistors can be reduced.

6 Claims, 5 Drawing Sheets

SEMICONDUCTOR APPARATUS OF A PLURALITY OF SEMICONDUCTOR DEVICES ENCLOSED IN CASE AND WIRING METHOD THEREFORE

BACKGROUND OF THE INVENTION

1. Field of the Invention

The present invention relates to a semiconductor apparatus formed by enclosing a plurality of semiconductor devices in a case of resin, etc. and a wiring method for the semiconductor apparatus.

2. Description of the Related Art

A power module faces the task of reducing the circuit inductance in a power module using a switching element of a larger capacity and a higher switching frequency.

As a method for reducing a circuit inductance, for example, Japanese Patent Publication No.2001-102519 suggests a power semiconductor module in which a first electrode pattern connected to a first electrode of the semiconductor device and a second electrode pattern connected to a second electrode of the semiconductor device are formed. With the configuration, a first electrode wiring conductor connected to the first electrode pattern and a second electrode wiring conductor connected to the second electrode pattern are provided above the second electrode pattern to successfully reduce the parasitic inductance of a circuit.

To realize a smaller and low-cost semiconductor module with high reliability, the configuration of inserting a wiring conductor having an external connection terminal into a case of resin, etc. has been suggested.

Figure 1:
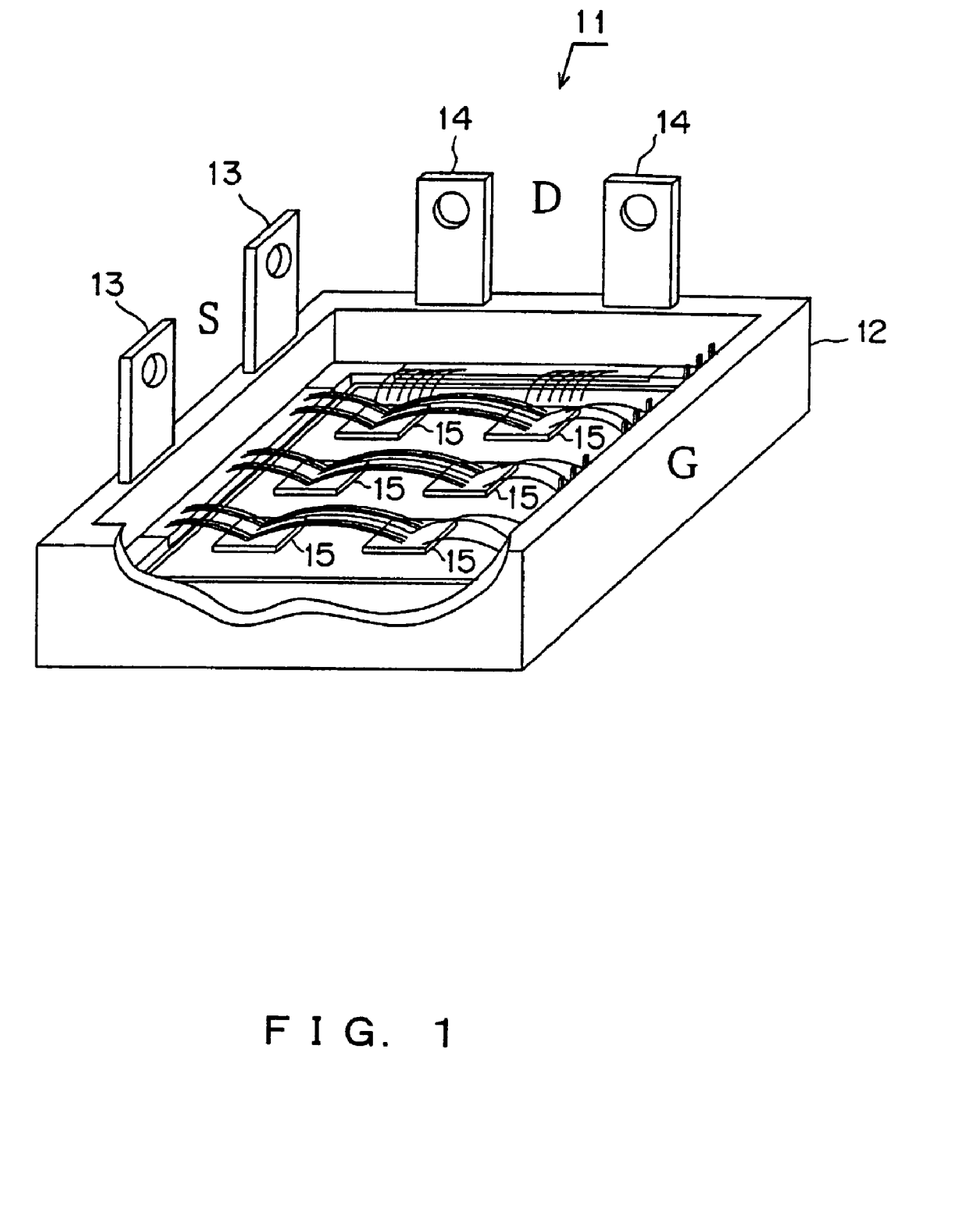
FIG. 1 shows the internal structure of a semiconductor module.

FIG. 1 shows the internal structure of a semiconductor module 11 including a plurality of semiconductor devices 15.

A wiring conductor for connection of an external connection terminal 13 to the source of the semiconductor device 15, and a wiring conductor for connection of an external connection terminal 14 to the drain of the semiconductor device 15 are inserted into a resin case 12.

The invention described in Japanese Patent Publication No.2001-102519 has the problem that the structure is complicated, and the number of assembly steps increases.

In the semiconductor module 11 shown in FIG. 1, the external connection terminal 14 and the external connection terminal 13 are mounted on the separate sides so that they can be connected to the semiconductor device 15 through the bonding pads provided for the respective sides.

However, in the wired structure as shown in FIG. 1, the current path of the drain current cannot be set parallel to the current path of the source current. Therefore, it is difficult to reduce the parasitic inductance of a circuit.

The object of the present invention is to reduce the parasitic inductance without increasing the number of assembly steps.

SUMMARY OF THE INVENTION

The semiconductor apparatus according to the present invention is formed by enclosing a plurality of semiconductor devices in a case. In the semiconductor apparatus, each of the first and second wiring conductor through which a main current of the semiconductor device flows has an external connection terminal at one end, and being inserted into the case such that each wiring conductor can extend parallel to each other with the currents of the first and second wiring conductors flowing in the opposite directions.

According to the invention, the first wiring conductor and the second wiring conductor extend in parallel, and the directions of their currents are opposite, thereby successfully reducing the parasitic inductance.

In the above mentioned invention, the first external connection terminal of the first wiring conductor can be exposed to the outside of the resin case from the vicinity of the end portion of the first side of the frame of the resin case, and the second external connection terminal of the second wiring conductor can be exposed to the outside of the resin case from a side different from the first side of the frame.

With the above mentioned configuration, the first and second wiring conductors inserted into the resin case extend outside in parallel with the currents flowing in the opposite directions. Thus, for example, the current entering through the first external connection terminal passes the first wiring conductor inserted into the resin case, and enters the first electrode of the semiconductor device. Further, it passes through the second electrode of the semiconductor device and the second wiring conductor extending parallel to the first wiring conductor, and exits from the second external connection terminal. Therefore, the flow of the current through the first wiring conductor is opposite in direction to the flow of the current through the second wiring conductor, thereby reducing the parasitic inductance of the first and second wiring conductors.

In the above mentioned invention, the first connection unit of the first wiring conductor connected to the first electrode of the semiconductor device can be provided on the first side of the case, and the second connection unit of the second wiring conductor connected to the second electrode of the semiconductor device can be provided on a side different from the first side.

With the configuration, the position of the wire bonding between the first electrode and the second electrode can be arbitrarily set, thereby enhancing the flexibility in arranging parts.

In the above mentioned invention, the first external connection terminal can be provided on one side of the frame of the case, and the second external connection terminal can be mounted on a portion other than the frame of the case.

With the configuration, the external connection terminal can be mounted in the position other than the frame of the case. Therefore, the flexibility in wiring an external circuit connected to the semiconductor apparatus can be increased.

In the above mentioned invention, the surfaces on which the first wiring conductor and the second wiring conductor extend can be set parallel to the bottom of the case with the surfaces on which they extend can be set opposite to each other.

With the configuration, the parasitic inductance by the first wiring conductor and the second wiring conductor can be further reduced.

In the above mentioned invention, the surfaces on which the first wiring conductor and the second wiring conductor extend parallel to each other can be set perpendicular to the bottom of the case.

With the configuration, the parasitic inductance of the semiconductor apparatus can be reduced, and the apparatus can be smaller.

DESCRIPTION OF THE PREFERRED EMBODIMENTS

Figure 2:
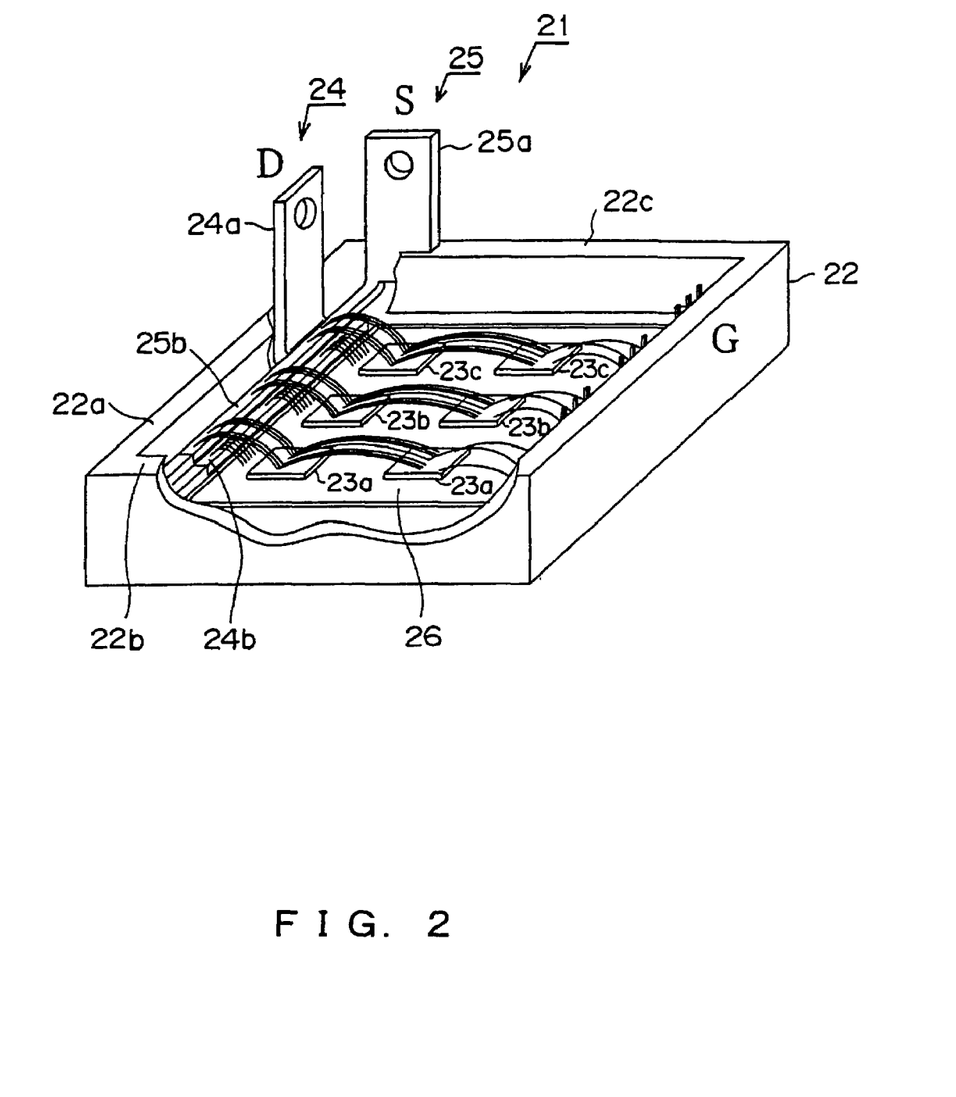
FIG. 2 shows the internal structure of the semiconductor module according to the first embodiment of the present invention.

The embodiments of the present invention are described below by referring to the attached drawings. FIG. 2 shows the internal structure of a power semiconductor module 21 according to the first embodiment of the present invention.

The power semiconductor module (hereinafter referred to as a semiconductor module) 21 according to the first embodiment contains six semiconductor devices 23*a* through 23*c* comprising MOS transistors, and a drain electrode wiring conductor 24 connected to the drain electrodes of the semiconductor devices 23*a* through 23*c* and a source electrode wiring conductor 25 connected to the source electrodes are inserted into a case 22 of resin, etc.

According to the embodiment, the drain electrodes and the source electrodes refer to the drain and source of the semiconductor devices 23*a* through 23*c*, or the connection areas for the wire bonding, or the connection area for wire bonding provided on the conductor layer directly connected to the semiconductor devices 23*a* through 23*c*, the conductor layer connected through wire, a metal plate, etc.

The drain electrode wiring conductor 24 is inserted into one side 22*a* of the frame of the case 22, and one end extends (is exposed) from above the vicinity of the right end portion to the outside, and forms an external connection terminal 24*a*.

The other end of the drain electrode wiring conductor 24 takes the form of a flat board, and extends along the side 22*a* of the frame of the case 22. The drain electrode wiring conductor 24 extending along the side 22*a* is exposed extending along the side 22*a* is exposed at the lower stage of the case 22, and forms a connection unit 24*b*. The connection unit 24*b* is connected to the substrate connected to the drain electrodes of the semiconductor devices 23*a* through 23*c* through the wire bonding.

The source electrode wiring conductor 25 is inserted into the side 22*a* and a side 22*c* of the case 22, and its one end extends outside in the vicinity of the left end portion of the side 22*c* of the case 22, and forms an external connection terminal 25*a*. The other end of the source electrode wiring conductor 25 takes the form of a flat board, and extends parallel to the drain electrode wiring conductor 24. Furthermore, the source electrode wiring conductor 25 is exposed at the upper stage of the side 22*a*, and forms a connection unit 25*b* connected to the source electrodes of the semiconductor devices 23*a* through 23*c*.

The connection unit 24*b* of the drain electrode wiring conductor 24 formed at the lower stage of the case 22 is provided to the right of the connection unit 25*b* of the source electrode wiring conductor 25 at the upper stage, that is, closer to the semiconductor devices 23*a* through 23*c*. Therefore, when the wire bonding between the drain electrodes and the source electrodes of the semiconductor devices 23*a* through 23*c* is performed in the position where the wires overlap as viewed from above, the connection unit 24*b* at the lower stage can be first wire-bonded with the drain electrode, and then the connection unit 25*b* at the upper stage can be wire-bonded with the source electrode as connection over the first bonding wire, thereby preventing the lower wire from interfering with the upper wire bonding.

The source electrode wiring conductor 25 at the upper stage of the case 22 is completely insulated from the unexposed portion of the drain electrode wiring conductor 24 at the lower stage by the case 22 of resin, etc.

The current flowing through the semiconductor module 21 with the above mentioned configuration is described below.

Assuming that the current flows from the external connection terminal 24*a* of the drain electrode wiring conductor 24 to the external connection terminal 25*a* of the source electrode wiring conductor 25, the current entering through the external connection terminal 24*a* passes the connection unit 24*b* extending along the lower stage of the case 22, and enters the drain electrodes of the semiconductor devices 23*a* through 23*c* after passing through a conductor layer 26 of the substrate. When the current enters the drain electrodes, it passes through the source electrodes of the semiconductor devices 23*a* through 23*c*, and then the connection unit 25*b* of the source electrode wiring conductor 25 extending parallel to the connection unit 24*b* of the drain electrode wiring conductor 24, and exits outside from the external connection terminal 25*a*.

That is, the current entering from the external connection terminal 24*a* of the drain electrode wiring conductor 24 enters the drain electrodes of the semiconductor devices 23*a* through 23*c* after flowing down as shown in FIG. 2 in the connection unit 24*b* of the drain electrode wiring conductor 24 extending parallel to the side 22*a*. Then, the current exiting the source electrodes of the semiconductor devices 23*a* through 23*c* flows upward as shown in FIG. 2 in the connection unit 25*b* of the source electrode wiring conductor 25, thereby exiting outside from the external connection terminal 25*a*.

According to the first embodiment, the drain electrode wiring conductor 24 and the source electrode wiring conductor 25 can be inserted into the case 22, the external connection terminal 24*a* of the drain electrode wiring conductor 24 is provided near the end portion of the side 22*a*, and the drain electrode wiring conductor 24 and the source electrode wiring conductor 25 are allowed to extend parallel to the side 22*a* of the case 22, thereby setting the flow of the current through the drain electrode wiring conductor 24 opposite in direction to the flow of the current through the source electrode wiring conductor 25.

Thus, since the magnetic flux generated by the current through the drain electrode wiring conductor 24 and the current through the source electrode wiring conductor 25 offset each other, the parasitic inductance in the case 22 can be reduced.

According to the present embodiment, the connection unit 24*b* at the lower stage is connected to the drain electrode, and the connection unit 25*b* at the upper stage is connected to the source electrode. However, the present invention is not limited to this application, but the connection unit at the lower stage can be connected to the source electrode, and the connection unit at the upper stage can be connected to the drain electrode.

Figure 3:
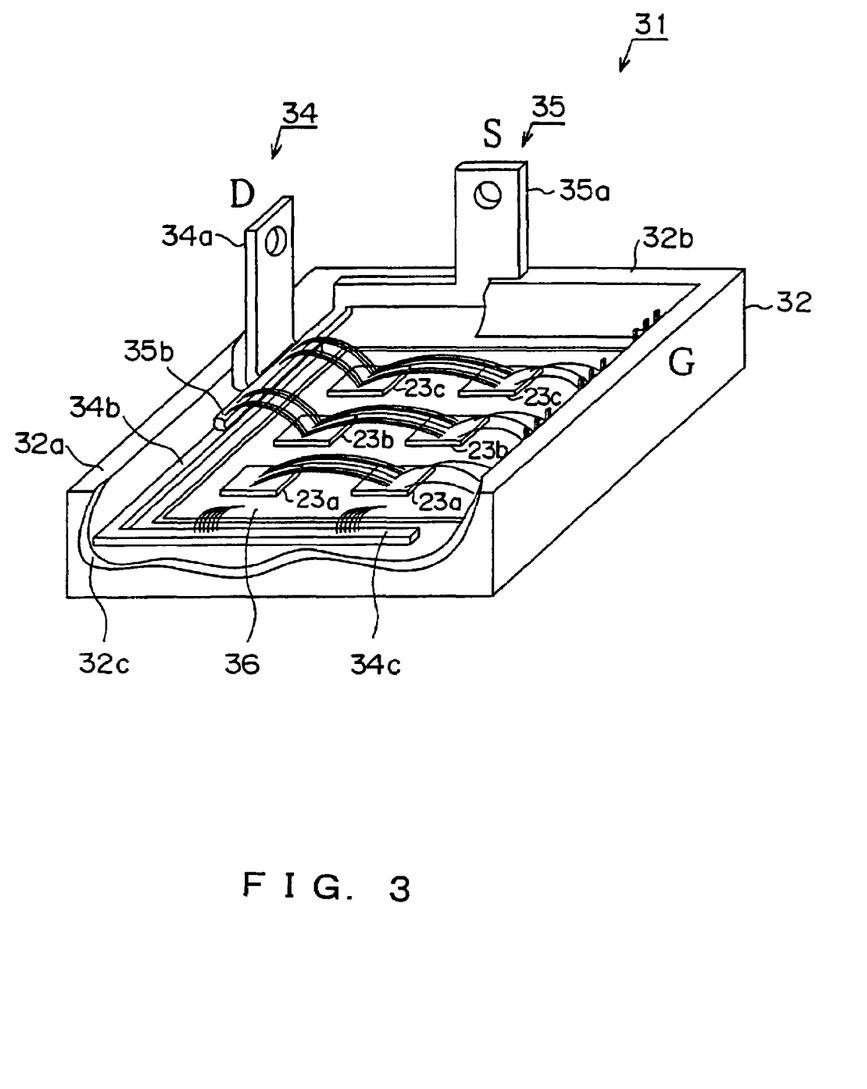
FIG. 3 shows the internal structure of the semiconductor module according to the second embodiment of the present invention.

FIG. 3 shows the internal structure of a semiconductor module 31 according to the second embodiment of the present invention.

According to the second embodiment, a drain electrode wiring conductor 34 is inserted into a side 32a of the frame of a case 32 and a side 32c on the near side, and the source electrode wiring conductor 35 is inserted into a side 32b and the side 32a of the frame of the case 32.

One end of the drain electrode wiring conductor 34 extends upwards from above the right end of the side 32a of the case 32, and forms an external connection terminal 34a. The other end of the drain electrode wiring conductor 34 takes the form of a flat board, extends along the side 32a, forms an intermediate portion 34b, being bent by 90° at the corner made by the side 32a and the side 32c, extends along the side 32c, being exposed at the stage of the side 32c, and forms a connection unit 34c. The connection unit 34c is connected to the conductor layer 36 of the substrate connected to the drain electrodes of the semiconductor devices 23a through 23c through the wire.

That is, the connection unit 34c of the drain electrode wiring conductor 34 is mounted on the side 32c opposing the side 32b for which an external connection terminal 35a of a source electrode wiring conductor 35 described later is provided.

One end of the source electrode wiring conductor 35 extends upwards from above the substantially central portion of the side 32b of the case 32, and forms the external connection terminal 35a. The other end of the source electrode wiring conductor 35 takes the form of a flat board or a rectangular pillar, extends upwards above the intermediate portion 34b of the drain electrode wiring conductor 34, and forms the connection unit 35b connected to the source electrodes of the semiconductor devices 23a through 23c.

Described below is the current flowing through the semiconductor module 31 with the above mentioned configuration.

Assuming that a current flows in the direction from the external connection terminal 34a of the drain electrode wiring conductor 34 to the external connection terminal 35a of the source electrode wiring conductor 35, the current entering from the external connection terminal 34a enters a conductor layer 36 from the connection unit 34c of the drain electrode wiring conductor 34 extending along the lower stage of the case 32. The current entering the conductor layer 36 further enters the drain electrodes of the semiconductor devices 23a through 23c, passes through the connection unit 35b of the source electrode wiring conductor 35 from the source electrodes of the semiconductor devices 23a through 23c, and exits from the external connection terminal 35a.

That is, the current entering from the external connection terminal 34a of the drain electrode flows through the intermediate portion 34b of the drain electrode wiring conductor 34 extending parallel to the side 32a downwards as shown in FIG. 3, and enters the drain electrodes of the semiconductor devices 23a through 23c from the curved connection unit 34c. The current which has entered the drain electrodes of the semiconductor devices 23a through 23c passes through the source electrode, flows through the connection unit 35b of the source electrode wiring conductor 35 extending parallel to the drain electrode wiring conductor 34 upwards as shown in FIG. 3, and exits from the external connection terminal 35a.

According to the second embodiment, the external connection terminal 34a of the drain electrode wiring conductor 34 extends outside from the vicinity of the right end of the side 32a of the case 32, the external connection terminal 35a of the source electrode wiring conductor 35 extends outside from the side 32b to the left of the side 32a, and the drain electrode wiring conductor 34 and the source electrode wiring conductor 35 extend parallel to each other. As a result, the current in the drain electrode wiring conductor 34 and the current in the source electrode wiring conductor 35 flow in the opposite directions in the side 32a.

Thus, since the magnetic fluxes generated by the currents in the drain electrode wiring conductor 34 and the source electrode wiring conductor 35 can be offset, the parasitic inductance on the semiconductor module 31 can be reduced.

Furthermore, the wire bonding between the connection unit 34c and the conductor layer 36 (connected to the drains of the semiconductor devices 23a through 23c) can be performed apart from the wire bonding between the connection unit 35b and the source electrodes of the semiconductor devices 23a through 23c by providing the connection unit 34c of the drain electrode wiring conductor 34 on the side 32c different from the side 32a on which the connection unit 35b of the source electrode wiring conductor 35 is provided, thereby reducing the restrictions on the bonding operation.

Figure 4:
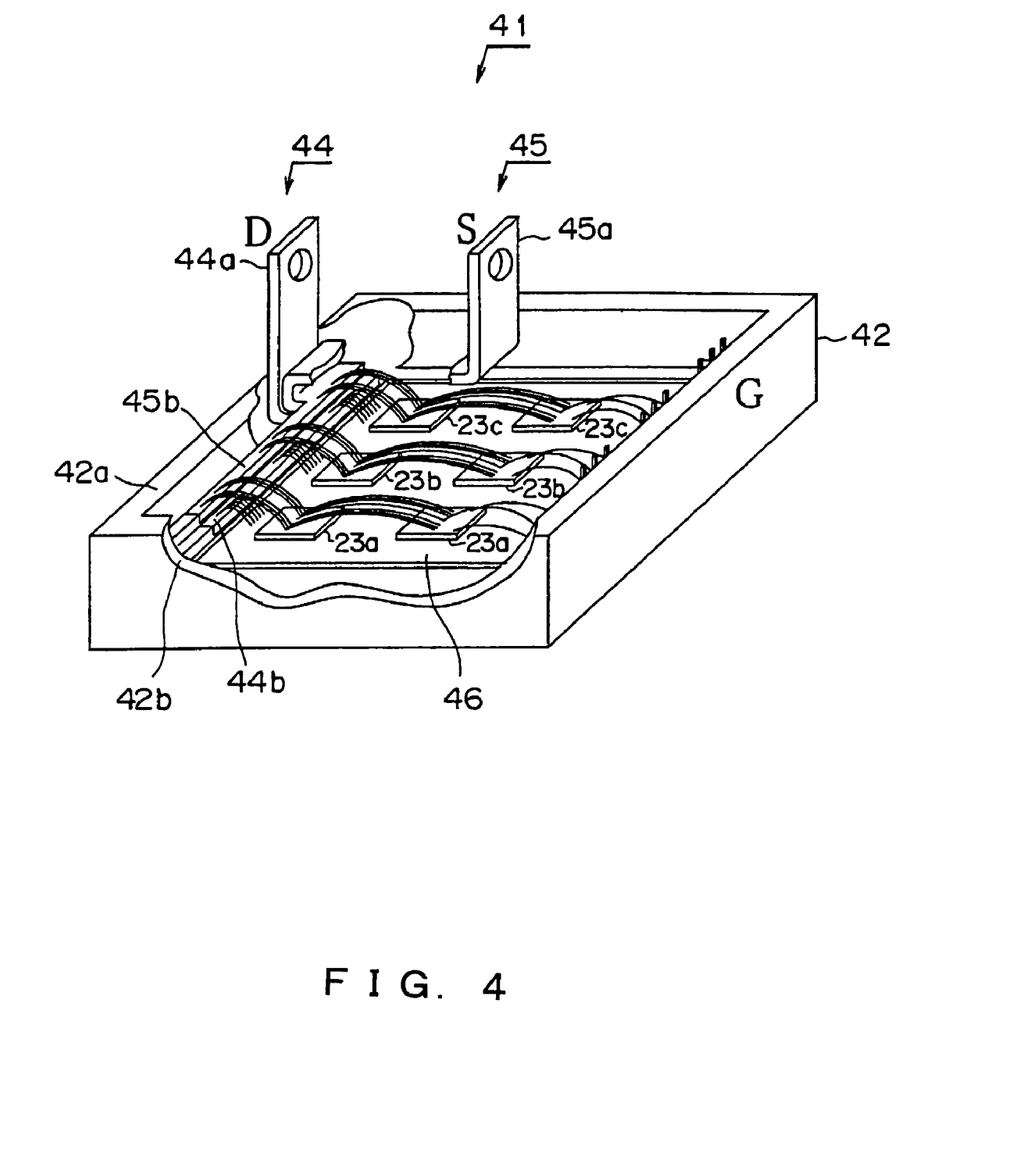
FIG. 4 shows the internal structure of the semiconductor module according to the third embodiment of the present invention.

FIG. 4 shows the internal structure of the semiconductor module according to the third embodiment of the present invention.

The third embodiment is also configured by a drain electrode wiring conductor 44 and a source electrode wiring conductor 45 incorporated into a case 42.

The drain electrode wiring conductor 44 is inserted into a side 42a of the frame of the case 42, and one end of the conductor extends outside from above the side 42a of the case 42, and forms an external connection terminal 44a. The other end of the drain electrode wiring conductor 44 takes the form of a flat board, extends along the side 42a, being exposed at the stage of the case 42, and forms a connection unit 44b. The connection unit 44b is connected through a wire, etc. to a conductor layer 46 of the substrate connected to the drain electrodes of the semiconductor devices 23a through 23c.

The source electrode wiring conductor 45 is inserted into the side 42a of the frame of the case 42, and one end of the conductor extends parallel to the bottom of the case 42 in the direction perpendicular to the side 42a, thereby forming an external connection terminal 45a. The external connection terminal 45a is formed above perpendicular to the bottom when the wire bonding is performed, and is bent upward above the wire bonding portion after the wire bonding process. Therefore, the external connection terminal 45a does not actually interfere with the wire bonding operation.

The other end of the source electrode wiring conductor 45 takes the form of a flat board or a rectangular pillar, extends above parallel to the drain electrode wiring conductor 44, and forms a connection unit 45b connected to the source electrodes of the semiconductor devices 23a through 23c.

Like the above mentioned first embodiment, the third embodiment has the configuration in which the current entering from the external connection terminal 44a flows through the connection unit 44b of the drain electrode wiring conductor 44 downward as shown in FIG. 4, and enters the drain electrodes of the semiconductor devices 23a through 23c. Then the current exiting from the source electrodes of the semiconductor devices 23a through 23c flows upward as shown in FIG. 4, and exits from the external connection terminal 45a.

Therefore, on the side 42a, flow of the current through the drain electrode wiring conductor 44 is opposite in direction to the flow of the current through the source electrode wiring conductor 45. Therefore, the magnetic fluxes generated by the currents are offset. Thus, the parasitic inductance in the semiconductor module 41 can be reduced. Furthermore, according to the third embodiment, the position of the external connection terminal 45*a* is not limited to the frame of the case 42. Therefore, the position of the external connection terminal 45*a* can be changed based on the arrangement of the connection unit of the external circuit. Furthermore, the semiconductor module 41 can be set smaller.

The external connection terminal 45*a* of the source electrode wiring conductor 45 can be arranged on the side of the frame, and the external connection terminal 44*a* of the drain side can be arranged in the position other than the frame. Otherwise, when space can be reserved not to interfere the wire bonding, both external connection terminals can be arranged in the positions other than the frame of the case 42.

Figure 5:
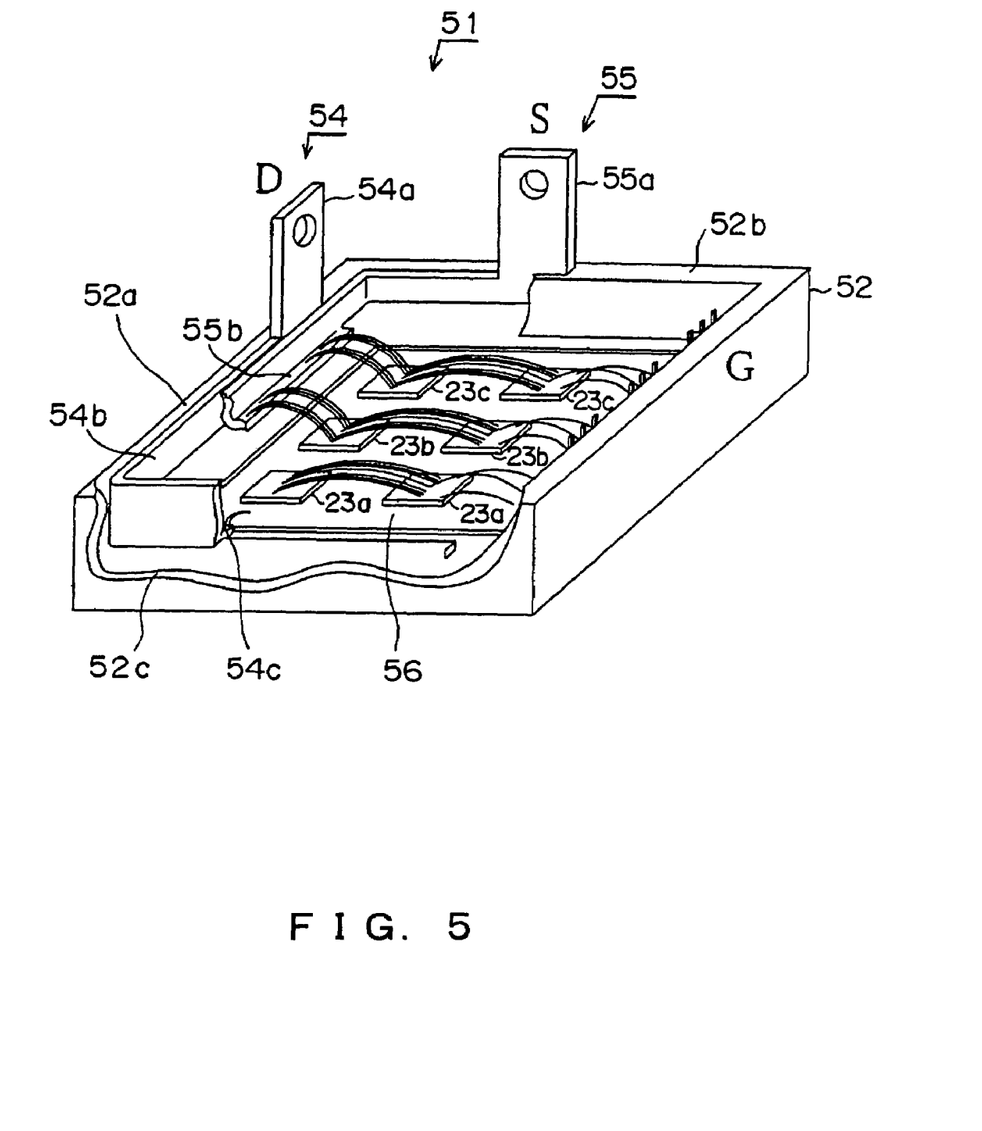
FIG. 5 shows the internal structure of the semiconductor module according to the fourth embodiment of the present invention.

FIG. 5 shows the internal structure of the semiconductor module according to the fourth embodiment of the present invention.

The fourth embodiment is also configured by a drain electrode wiring conductor 54 and a source electrode wiring conductor 55 inserted and incorporated into a case 52.

The drain electrode wiring conductor 54 is inserted into sides 52*a* and 52*c* of the frame of the case 52, and one end extends upward from above the vicinity of the right end portion of the side 52*a*, and forms the external connection terminal 54*a*. The other end of the drain electrode wiring conductor 54 extends along the sides 52*a* and 52*c*, takes the form of a board along the side 52*a*, and provided perpendicular to the bottom surface of the case 52. It also takes the form of the character L substantially in section along the side 52*c*, and the lower part of the L-shaped portion is exposed at the stage of the side 52*c*, thereby forming a connection unit 54*c*. The above mentioned connection unit 54*c* is connected through a wire, etc. to a conductor layer 56 of the substrate connected to the drain electrodes of the semiconductor devices 23*a* through 23*c*.

The source electrode wiring conductor 55 is inserted into the sides 52*a* and 52*b* of the frame of the case 52, and one end extends upward right from the substantially central point of the side 52*b*, and forms an external connection terminal 55*a*. The other end of the source electrode wiring conductor 55 is substantially L-shaped in section, provided upward perpendicular to the bottom surface of the case 52, extends parallel to the drain electrode wiring conductor 54, being exposed at the stage, and forms a connection unit 55*b*. The connection unit 55*b* is connected to the source electrodes of the semiconductor devices 23*a* through 23*c*.

The current flowing through a semiconductor module 51 according to the fourth embodiment is basically the same as that according to the above mentioned second embodiment.

That is, the current entering from an external connection terminal 54*a* of the drain electrode wiring conductor 54 enters the conductor layer 56 through the connection unit 54*c* of the drain electrode wiring conductor 54 extending along the sides 52*a* and 52*c*. The current entering the conductor layer 56 flows into the drain electrodes of the semiconductor devices 23*a* through 23*c*, passes through the connection unit 55*b* of the source electrode wiring conductor 55 extending along the side and the bottom of the case 52 from the semiconductor devices 23*a* through 23*c*, and exits from the external connection terminal 55*a*.

Therefore, the current flows downward as shown in FIG. 5 through the drain electrode wiring conductor 54 extending parallel to the side 52*a*, and the current (flowing upward as shown in FIG. 5) flows opposite in direction to the current flowing in the drain electrode wiring conductor 54.

Thus, the magnetic fluxes generated by the current flowing through the drain electrode wiring conductor 54 and the current flowing through the source electrode wiring conductor 55 offset each other, thereby successfully reducing the parasitic inductance in the semiconductor module 51. Furthermore, the wire bonding between the drain electrode wiring conductor 54 and the conductor layer 56 and the wire bonding between the source electrode wiring conductor 55 and the semiconductor devices 23*a* through 23*c*, and the wire bonding between the source electrode wiring conductor 55 and the semiconductor devices 23*a* through 23*c* can be performed on the different sides in the case 52, thereby reducing the restriction conditions for the bonding operations. Furthermore, since the surfaces of the drain electrode wiring conductor 54 and source electrode wiring conductor 55 facing each other are perpendicular to the bottom surface of the case 52, the ratio of area occupied by the drain electrode wiring conductor 54 and the source electrode wiring conductor 55 to the bottom area of the case 52 of the source electrode wiring conductor 55 can be reduced.

The present invention is not limited to the above mentioned embodiment, but can also be configured as follows.

(a) The external connection terminals 24*a*, 34*a*, 44*a*, and 54*a* of the drain electrode wiring conductors 24, 34, 44, and 54 and the external connection terminals 25*a*, 35*a*, 45*a*, and 55*a* of the source electrode wiring conductor 25, 35, 45, and 55 can also be provided, not limited to the right and left adjacent sides, but on the sides opposite each other. In this case, the drain electrode wiring conductors 24, 34, 44, and 54 are to extend parallel to the source electrode wiring conductor 25, 35, 45, and 55.

(b) The arrangement of the drain electrode wiring conductors 24, 34, 44, and 54 and the source electrode wiring conductors 25, 35, 45, and 55 is not limited to the above mentioned embodiments, but the inverse arrangement can also be acceptable.

(c) The application of the present invention is not limited to the MOS transistor, but the present invention can also be applied to any semiconductor modules using a switching element such as a bipolar transistor, thyristor, GTO, IGBT, etc.

(d) It is not always necessary that each terminal extends from the top surface of the side of a case, but, for example, can also extend horizontally from the outer side of the case, or can further be bent upward. Otherwise, it can also be extended horizontally from the inner side, and can further be bent upward.

(e) If a stepwise connection unit is provided as in the first or third embodiments, it is not always necessary to overlap the upper and lower wires, but they can be shifted to avoid overlapping. In this case, the wire bonding order can be set more flexibly.

According to the present invention, the first wiring conductor and the second wiring conductor extend parallel to each other with their currents flowing in the opposite directions, thereby reducing the parasitic inductance by the first and second wiring conductors.

What is claimed is:

1. A power semiconductor apparatus formed by inserting a plurality of semiconductor devices into a non-conductive case, comprising:

a first wiring conductor and a second wiring conductor, through which a main current of each semiconductor device flows, wherein an external terminal of the first wirina conductor and an external terminal of the second wiring conductor are exposed to an outside of the case from different side surfaces, wherein each wiring conductor is wire-bonded with a main electrode of one or more semiconductor device, wherein each of the first and second wiring conductors has a portion that extends in a direction parallel to each other along with the periphery of a bottom surface of the case, and wherein currents flowing through the portions of the first and second wiring conductors that are parallel to the bottom of the case and that extend the position along the vicinity of a side surface of the case are in opposite directions.

2. The apparatus according to claim 1, wherein the first external terminal of the first wiring conductor can be exposed to outside of a resin case from a vicinity of an end portion of a first side of a frame of the resin case, and the second external terminal of the second wiring conductor can be exposed to the outside of the resin case from a side different from the first side of the frame.

3. The apparatus according to claim 1, wherein a first connection unit of the first wiring conductor connected to a first electrode of the semiconductor device can be provided on a first side of the case, and a second connection unit of the second wiring conductor connected to a second electrode of the semiconductor device can be provided on a side different from the first side.

4. The apparatus according to claim 1, wherein the first external terminal can be provided on one side of the frame of the case, and the second external terminal can be mounted on a portion other than the frame of the case.

5. The apparatus according to claim 1, wherein surfaces on which the first wiring conductor and the second wiring conductor extend in parallel can be set parallel to a bottom of the case with surfaces on which the conductors extend can be set opposite to each other.

6. The apparatus according to claim 1, wherein surfaces on which the first wiring conductor and the second wiring conductor extend in parallel can be set perpendicular to the bottom of the case.

* * * * *